(12) United States Patent
Singh et al.

(10) Patent No.: US 6,788,104 B2
(45) Date of Patent: Sep. 7, 2004

(54) FIELD PROGRAMMABLE LOGIC DEVICE WITH EFFICIENT MEMORY UTILIZATION

(75) Inventors: Moninder Singh, New Delhi (IN); Anurag Chaudhry, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 10/186,346

(22) Filed: Jun. 28, 2002

(65) Prior Publication Data

US 2003/0001614 A1 Jan. 2, 2003

(30) Foreign Application Priority Data

Jun. 29, 2001 (IN) ..................................... 728/DEL/2001

(51) Int. Cl.[7] .......................................... H03K 19/177
(52) U.S. Cl. .............................. 326/39; 326/41; 326/38
(58) Field of Search ...................................... 326/38–41

(56) References Cited

U.S. PATENT DOCUMENTS

| | | | |
|---|---|---|---|
| 5,801,547 A | | 9/1998 | Kean ............................ 326/40 |
| 5,835,941 A | * | 11/1998 | Pawlowski ................... 711/117 |
| 5,933,023 A | * | 8/1999 | Young .......................... 326/40 |
| 6,462,577 B1 | * | 10/2002 | Lee et al. ..................... 326/40 |
| 6,532,515 B1 | * | 3/2003 | Morein ....................... 711/105 |

* cited by examiner

Primary Examiner—Vibol Tan
(74) Attorney, Agent, or Firm—Allen, Dyer, Doppelt, Milbrath & Gilchrist, P.A.; Lisa K. Jorgenson

(57) ABSTRACT

A field programmable logic device includes at least two independently configurable embedded memory structures. The memory structures may differ in at least one parameter, such as memory size, available configuration depths, and available configuration widths. As such, a more efficient memory utilization is provided.

10 Claims, 5 Drawing Sheets

FIELD PROGRAMMABLE LOGIC DEVICE WITH EFFICIENT MEMORY UTILIZATION

FIELD OF THE INVENTION

The present invention relates to the field of electronic circuits, and, more particularly, to programmable logic devices.

BACKGROUND OF THE INVENTION

Configurable memories are embedded in field programmable logic devices to provide on-chip fast random access memory (RAM). There are two types of memory resources commercially available, which are illustratively shown in FIG. 1. The first is the look-up table (LUT) type, which are found inside logic blocks 102 of FIG. 1. These may be combined in various configurations to provide memories of varying widths and depths, such as in the Xilinx XC4000 and Virtex devices, for example.

One drawback of such distributed memory resources is that the large memory formed by combining these resources may be relatively slow. Moreover, one has to provide read/write control circuitry for all of the LUTs. Further, if these LUTs are not used to implement memory, then the read/write control circuitry associated therewith is wasted.

The second type of on-chip memory resource includes large "blocks" of RAM bits 101, such as those provided by Xilinx and Altera. These can be configured to provide memories with varying widths and depths. Yet, one drawback associated with using blocks of RAM bits is that if a block (e.g., 4 k) is used to implement a small memory (e.g., 512×2)), then a significant amount of unused RAM bits (i.e., 3 K) will be wasted. Moreover, if a logical memory supports an odd width (e.g., 256×9), then even more resources are wasted.

U.S. Pat. No. 5,801,547 describes embedded memory structures of the same type which may be combined and configured independently. As such, these memory structures may similarly suffer from the above-described drawbacks.

SUMMARY OF THE INVENTION

The present invention provides a field programmable logic device including at least two independently configurable embedded memory structures. The memory structures differ in parameters such as memory size, available configuration depths, and/or available configuration widths to provide for a more efficient memory utilization.

More particularly, the memory structures may provide mutually exclusive configuration options in at least one configuration parameter. The memory structures may be combined to form larger configurations through interconnection of dedicated memory routing tracks and horizontal routing channels, where the dedicated memory routing tracks may include a plurality of bus-based vertical tracks originating from memory I/Os. Further, horizontal routing channels may include several routing tracks.

The dedicated memory routing track may interact with the horizontal routing channels through programmable switches. In addition, a single set of dedicated memory routing tracks may span one or more memory blocks and a plurality of horizontal routing channels. The upper and lower end of the dedicated memory routing tracks may be a set of bus-based bi-directional programmable buffers to connect different blocks of memory to form deeper and/or wider memories. Since each memory structure supports a subset of total configuration modes available, the size of the multiplexer at the input/output of the memories may be reduced to enhance the speed of access to the memories.

Furthermore, the memory structures may be used independently or in combination to implement logic functions. The memory structures may also be multi-port structures, and may be implemented as read only memory (ROM), random access memory (RAM), content addressable memory (CAM), and first in first out (FIFO) structures, for example.

BRIEF DESCRIPTION OF THE DRAWINGS

Various objects and advantages of the invention will become more apparent with reference to the following description and the accompanying drawings, in which.

DETAILED DESCRIPTION OF THE PREFERRED EMBODIMENTS

In accordance with the invention, two or more types of memory resources are provided where the two types are distinguishable by the configuration modes they support, their size, or both. For ease of understanding, consider two types of memory resources. In one embodiment, the different memory structures can be distinguished both on the basis of the configuration modes they support and their sizes, as shown in FIG. 2.

Figure 1:
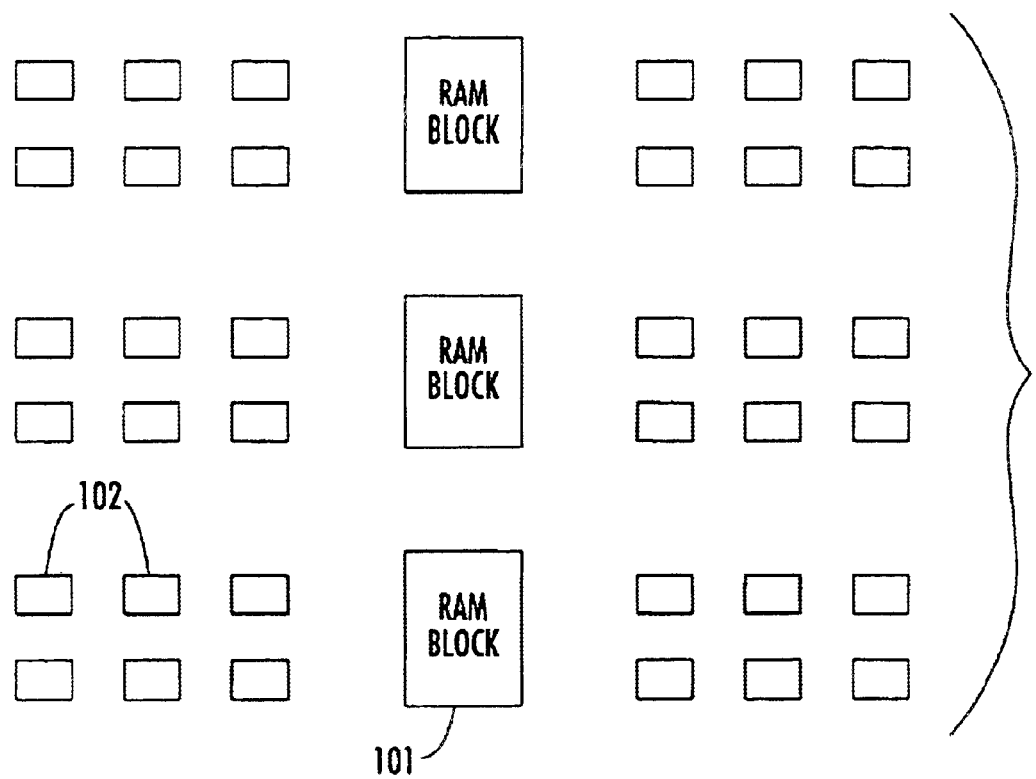
FIG. 1 is a schematic block diagram of a memory structure according to the prior art including a single type of embedded memory array.
Figure 2:
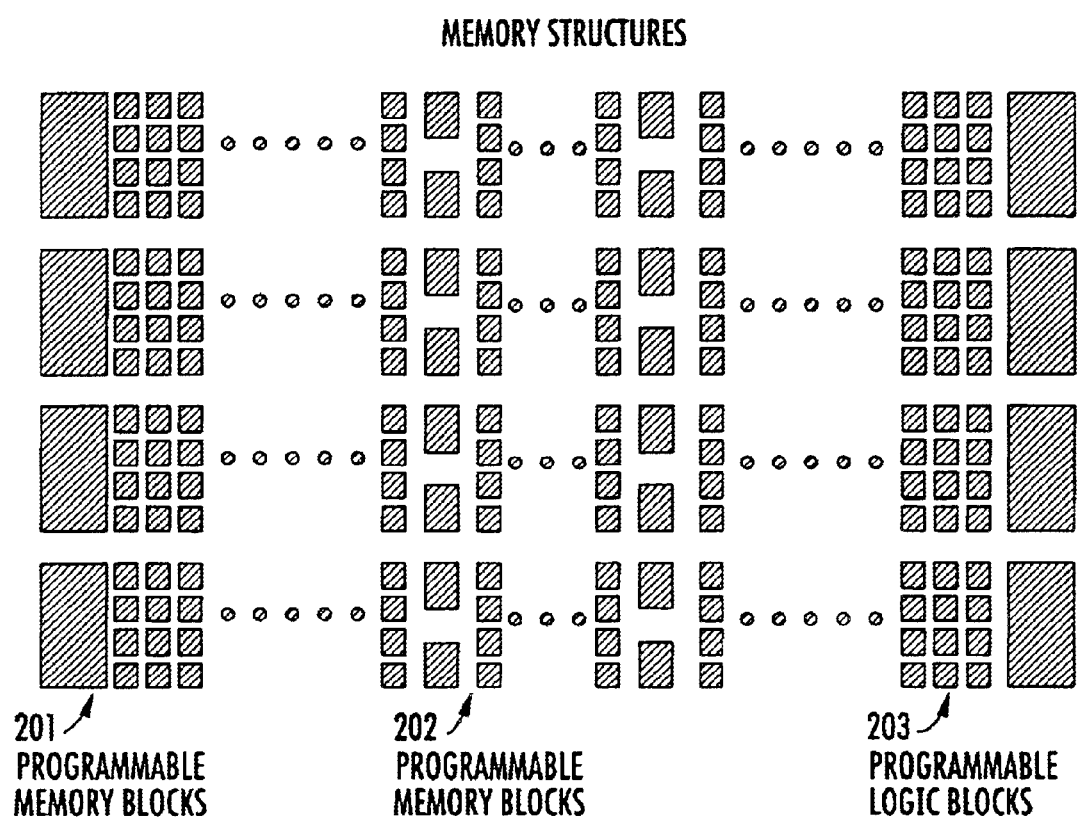
FIG. 2 is a schematic block diagram of a memory structure according to present invention in which two types of embedded memory arrays are provided.

The programmable logic device illustrated in FIG. 2 includes three types of programmable resources 201, 202, 203. The components 201 are programmable memory blocks with wider configurable data widths and/or larger core sizes than the components 202. The components 202 are programmable memory blocks with smaller configurable data widths and/or smaller core sizes than the components 201. The components 203 are programmable logic blocks that can be any of a PLA or LUT based circuit to implement logic intensive circuits.

The components 202 support small memory requirements (memory size) with a plurality of smaller configurable word sizes, e.g., x1, x2, and x4. The smaller configurable memory arrays can be combined using dedicated (bus-based) as well as general routing resources to create wider or deeper memories. The components 201 support large memory requirements (memory size) with a plurality of larger configurable word sizes, e.g., x8, x16, and x32. The larger memory arrays can also be combined using separate dedicated (bus-based) as well as general routing resources to create wider or deeper memories.

Since each memory structure is supporting only a subset of the total configuration modes available, the size of the multiplexer at the input/output of the memories will be reduced. Reduced flexibility at each level enhances the speed of operation at both levels, though it does not affect the overall number of possible combinations of different word sizes available. As the configuration modes supported by both types of memory structures are mutually exclusive, they do not interact with each other and no separate routing resources between the two types of memory structures are needed.

Figure 3:
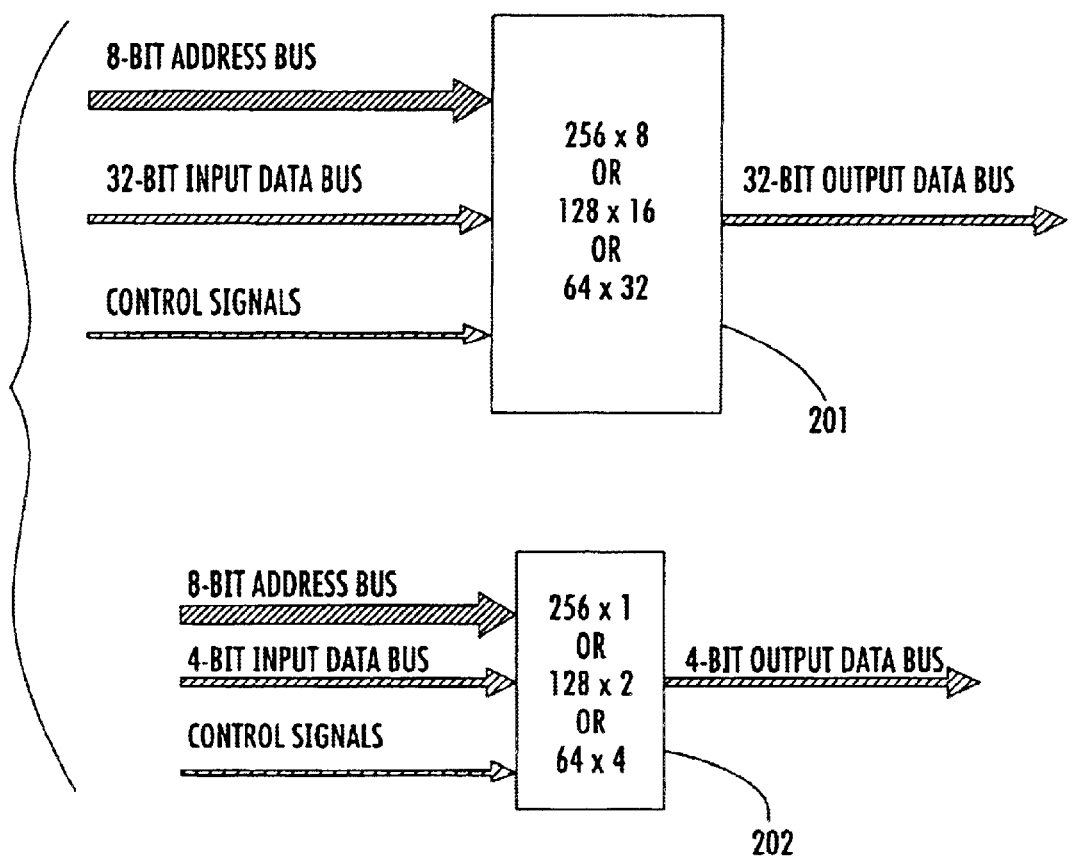
FIG. 3 is a schematic block diagram illustrating the use of two different configurable memory structures to obtain memories of different widths in accordance with the present invention.

Referring additionally to FIG. 3, if the size of the smaller memory structure is 256 bits and that of the larger memory structure is 2 Kbits (implying that the smaller memory can implement any of 256×1, 128×2 or 64×4 and the larger memory can implement any of 256×8, 128×16 or 64×32), then x9, x18, x36 modes can also be easily realized as the memory depth in both the memory structures is the same.

Figure 4:
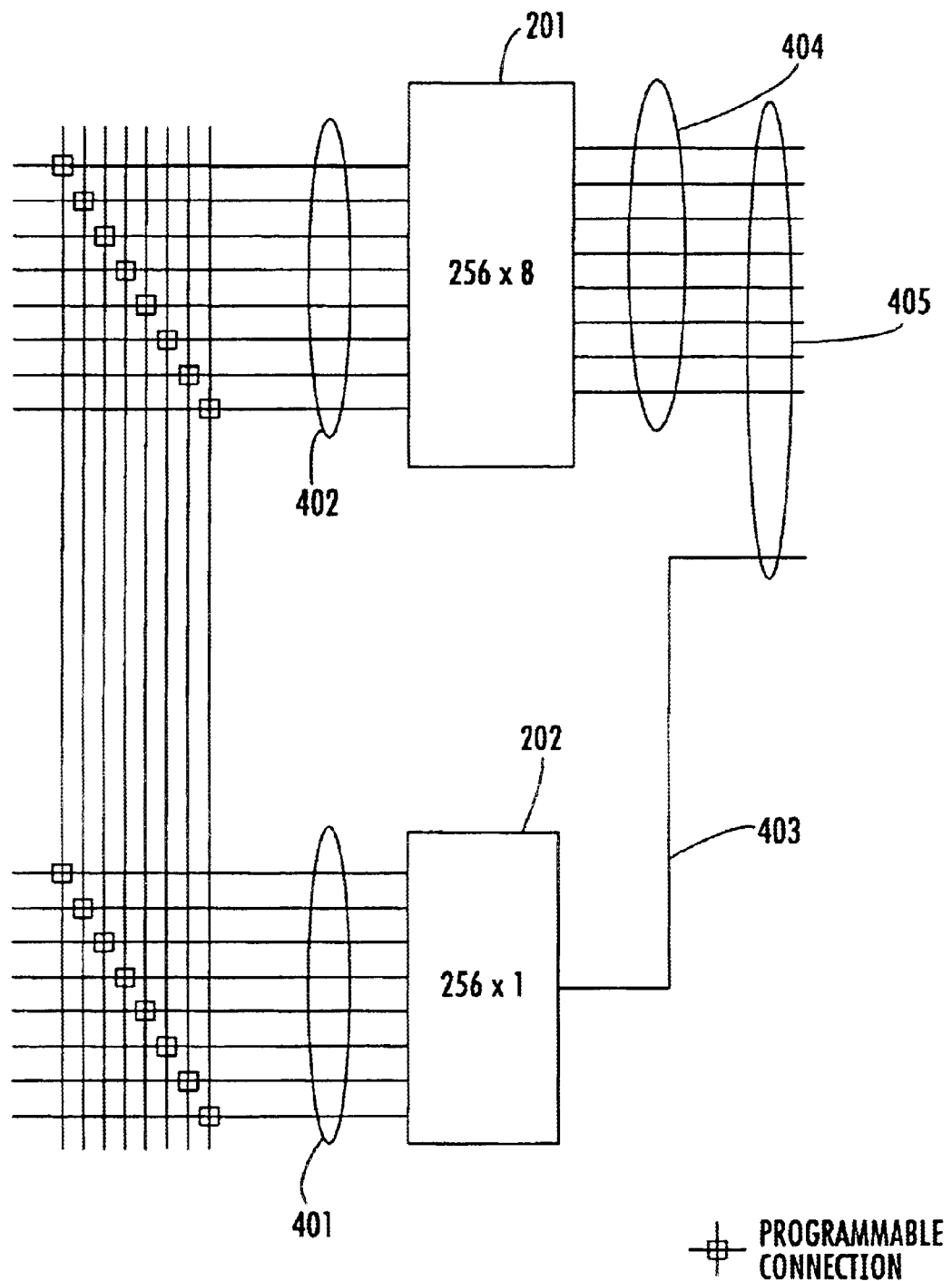
FIG. 4 is a schematic block diagram illustrating an implementation in accordance with the present invention of a 256×9 logical memory.

One such implementation is illustrated in FIG. 4. Here, a 256×9 logical memory is implemented, as may be required in certain designs. In this implementation, one memory block 201 and one memory block 202 are combined to form a memory block of a size 256×9. The memory block 202 is configured in 256×1 mode, i.e., this memory has 256 words of 1 bit each. To address 256 words, this memory requires 8 address lines 401, and its output data bus 403, is 1 bit wide. The memory block 201 is configured in 256×8 mode, which means that this memory has 256 words of 8 bits each. To address 256 words, this memory requires 8 address lines 402, and its output data bus 404 is 8 bits wide.

Now, to create a 256×9 memory block, the blocks 201 and 202 are combined in the following manner. The address buses of blocks 202 and 201, i.e., 401 and 402, are shorted. The short connection is provided through routing segments and programmable connections, as illustratively shown in FIG. 4. The output data buses of both the blocks together, i.e., 403 and 404, provide the data bus 405 of 256×9 memory.

Figure 5:
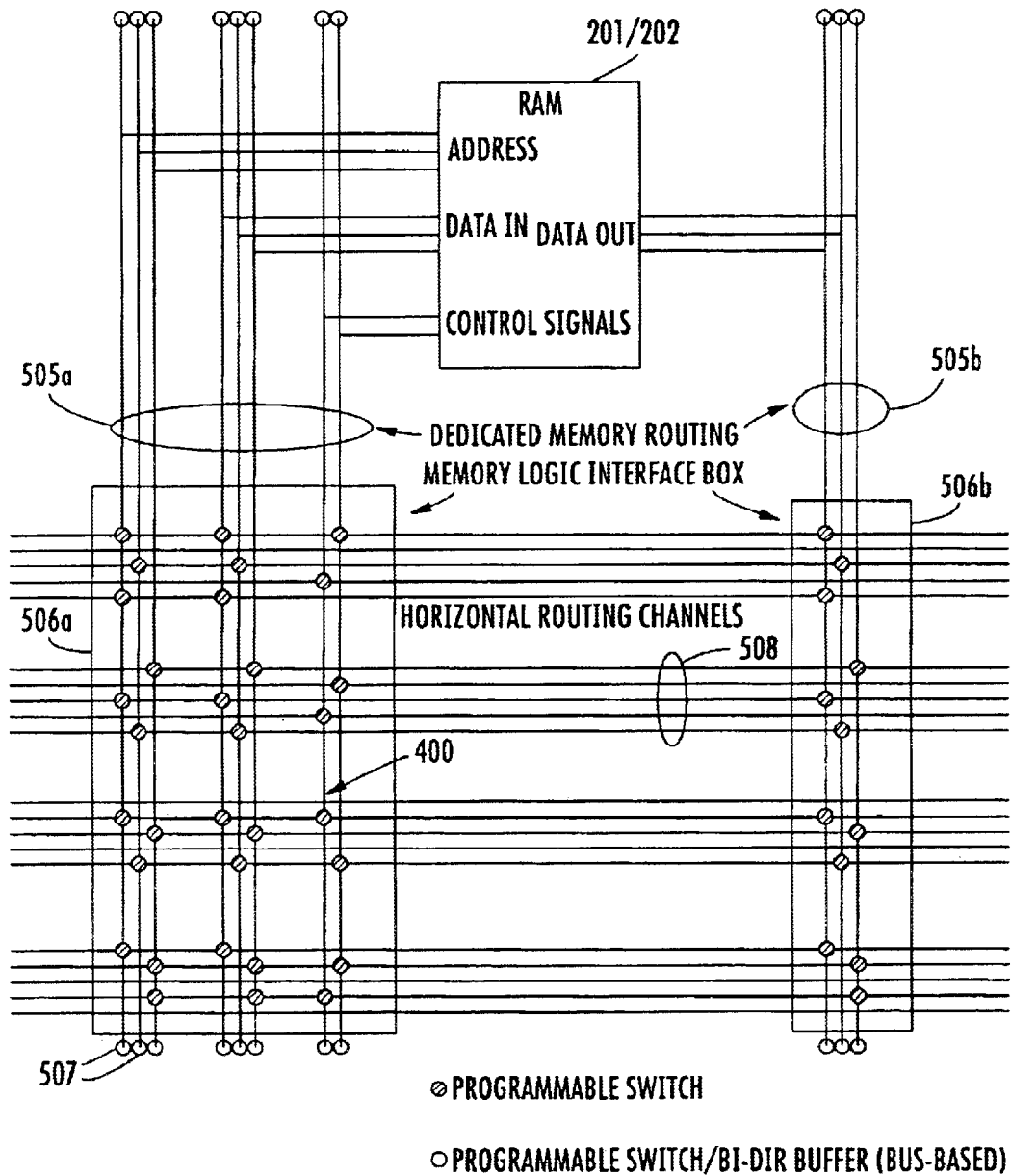
FIG. 5 is a schematic block diagram illustrating memory to memory and memory to logic interaction in accordance with the invention.

An exemplary memory to memory and memory to logic interaction scheme in accordance with the invention is shown in FIG. 5. The memory block (any of blocks 202 or 201) interacts with the logic blocks 203 and other memory blocks through dedicated memory routing tracks and horizontal routing channels. The dedicated memory routing tracks 505a and 505b include a plurality of bus-based vertical tracks (originating from memory I/Os) that interact with horizontal routing channels 508 through programmable switches 400. The horizontal routing tracks in turn interact with logic blocks. The horizontal routing channels also include several routing tracks. The dedicated memory routing tracks interact with horizontal routing channels through programmable switches.

A single set of dedicated memory routing tracks spans one (or more) memory block and a plurality of horizontal routing channels. At the upper and lower ends of the dedicated memory routing tracks are a set of bus-based, bi-directional programmable buffers 507 that help to connect different blocks of memories to form deeper and/or wider memories.

The connection box where the dedicated memory routing tracks interact with the horizontal routing channels is called the memory logic interface (designated 506a and 506b). The interconnections between memory blocks and logic blocks are made possible with this memory logic interface box. It should be noted that the attached figure is only a schematic representation. In actual connections the number of address and data lines may be larger than shown in the figure. Also, the number of tracks in the horizontal channel and the topology of switches in the memory logic interface box could be different as well.

In accordance with another embodiment of the invention, the different memory structures may differ based upon the configuration modes supported thereby, but they have the same size. In yet another embodiment, different memory structures may have different sizes, but they support the same configuration modes. Another possibility is that both, or any one of, the memories can be used in asynchronous ROM mode to implement logic when the design does not require all the on-chip memory resources that are provided. As such, this will save LUTs in all the cases considered above. Of course, it will be appreciated by those skilled in the art that the above teachings may be extended to more than two types of memory resources.

That which is claimed is:

1. A field programmable logic device comprising:
   a plurality of independently configurable, embedded memory structures;
   a plurality of logic interface devices;
   a plurality of routing tracks interconnecting said memory structures and connecting said memory structures to said logic interface devices, each routing track having first and second ends;
   a respective bi-directional programmable buffer connected to the first and second ends of each routing track; and
   a plurality of routing channels interconnecting said logic interface devices;
   each of the plurality of logic interface devices comprising a plurality of programmable switches connecting said routing tracks to said routing channels;
   said memory structures differing with respect to a configuration parameter comprising at least one of memory size, available memory configuration depth, and available memory configuration width, and said memory structures being configurable in a plurality of mutually exclusive configuration modes.

2. The field programmable logic device of claim 1 further comprising a plurality of memory input/outputs (I/Os); and wherein said routing tracks comprise bus-based tracks connected to said memory I/Os.

3. The field programmable logic device of claim 1 wherein at least some of said memory structures are configured to independently implement logic functions.

4. The field programmable logic device of claim 1 wherein at least some of said memory structures are configured to collectively implement logic functions.

5. The field programmable logic device of claim 1 wherein each of said memory structures comprises a multi-port memory structure.

6. The field programmable logic device of claim 1 wherein each of said memory structures comprises at least one of a read only memory (ROM) structure, a random access memory (RAM) structure, a content addressable memory (CAM) structure, and a first-in first-out (FIFO) memory structure.

7. A field programmable logic device comprising:
   a plurality of independently configurable, multi-port, embedded memory structures; and
   a plurality of logic interface devices;
   a plurality of routing tracks interconnecting said memory structures and connecting said memory structures to said logic interface devices, each routing track having first and second ends;
   a respective bi-directional programmable buffer connected to the first and second ends of each routing track; and a plurality of routing channels interconnecting said logic interface devices;

each of the plurality of logic interface devices comprising a plurality of programmable switches connecting said routing tracks to said routing channels;

said memory structures differing with respect to a configuration parameter comprising at least one of memory size, available memory configuration depth, and available memory configuration width, and said memory structures being configurable in a plurality of mutually exclusive configuration modes.

8. The field programmable logic device of claim 7 further comprising a plurality of memory input/outputs (I/Os); and wherein said routing tracks comprise bus-based tracks connected to said memory I/Os.

9. A method for making a programmable logic device comprising:

forming a plurality of independently configurable, embedded memory structures, the memory structures differing with respect to a configuration parameter thereof, and the memory structures being configurable in a plurality of mutually exclusive configuration modes;

providing a plurality of logic interface devices;

interconnecting said memory structures and connecting said memory structures to said logic interface devices with a plurality of routing tracks each having first and second ends;

connecting a respective bi-directional programmable buffer to the first and second ends of each routing track; and interconnecting said logic interface devices with a plurality of routing channels;

each of the plurality of logic interface devices comprising a plurality of programmable switches connecting said routing tracks to said routing channels.

10. The method of claim 9 wherein the configuration parameter comprises at least one of memory size, available memory configuration depth, and available memory configuration width.

\* \* \* \* \*